United States Patent [19]
Bruno

[11] Patent Number: 5,880,599
[45] Date of Patent: Mar. 9, 1999

[54] ON/OFF CONTROL FOR A BALANCED DIFFERENTIAL CURRENT MODE DRIVER

[75] Inventor: Kevin J. Bruno, Colorado Springs, Colo.

[73] Assignee: LSI Logic Corporation, Milpitas, Calif.

[21] Appl. No.: 764,547

[22] Filed: Dec. 11, 1996

[51] Int. Cl.⁶ .................................................. H03K 17/16
[52] U.S. Cl. ............................... 326/56; 326/33; 326/83; 327/52; 327/333
[58] Field of Search ................................. 326/33, 31, 34, 326/83, 86; 327/56, 52, 333, 108

[56] References Cited

U.S. PATENT DOCUMENTS

| | | | |
|---|---|---|---|
| 4,042,840 | 8/1977 | Chan | 326/56 |
| 4,314,362 | 2/1982 | Klaas et al. | 365/227 |
| 4,450,371 | 5/1984 | Bismarck | 326/83 |
| 4,614,882 | 9/1986 | Parker et al. | 307/443 |
| 4,644,196 | 2/1987 | Flannagan | 307/530 |
| 4,801,825 | 1/1989 | Stanley et al. | 326/56 |
| 4,808,853 | 2/1989 | Taylor | 307/473 |
| 5,103,159 | 4/1992 | Breugnot et al. | 323/315 |
| 5,124,580 | 6/1992 | Matthews et al. | 326/34 |
| 5,365,194 | 11/1994 | Sands, Jr. | 330/253 |
| 5,418,474 | 5/1995 | Davis et al. | 326/27 |
| 5,430,396 | 7/1995 | Morano | 326/90 |
| 5,453,678 | 9/1995 | Bertolini et al. | 323/282 |
| 5,517,130 | 5/1996 | Sandhu | 326/27 |
| 5,594,696 | 1/1997 | Komarek et al. | 327/52 |
| 5,801,565 | 9/1998 | Kuo | 327/202 |

*Primary Examiner*—Michael Tokar
*Assistant Examiner*—Daniel D. Chang
*Attorney, Agent, or Firm*—Duke W. Yee; Wayne P. Bailey

[57] ABSTRACT

A differential current mode driver is provided with output source and sink currents that remain nearly equal in magnitude and opposite in direction throughout normal, power-down, and power-up modes of operation. Three time constants are employed to regulate these different modes of operation. The differential current mode driver includes a first time constant to stabilize the output source and sink currents during the on-state, a second time constant to control the transition from the on-state to tristate, and a third time constant to control the transition from tristate to the on-state, all the while maintaining equal source and sink currents.

15 Claims, 7 Drawing Sheets

ON/OFF CONTROL FOR A BALANCED DIFFERENTIAL CURRENT MODE DRIVER

BACKGROUND OF THE INVENTION

1. Technical Field

The present invention relates generally to differential current mode drivers and in particular to differential current mode drivers used to assert a conductor in a differential small computer system interface bus. Still more particularly, the present invention relates to a differential current mode driver which maintains nearly equal source and sink currents while providing a stable on-state (normal mode), a controlled on-to-tristate transition (power-down), and a fast tristate-to-on transition (power-up).

2. Description of the Related Art

One application of differential current mode drivers relates to the small computer system interface ("SCSI" or commonly called the "SCSI bus"). Various versions of the SCSI standard have been proposed, approved, and/or adopted. Specifically, a differential current mode driver may be employed in an emerging SCSI standard known as "SCSI Parallel Interconnect 2" or "SPI-2" as documented in a working draft bearing the same title, currently at revision 11 dated Sep. 10, 1996, which is incorporated herein by reference.

SCSI specifications allow for both "single-ended" and "differential" buses. "Single-ended" SCSI buses use an unbalanced electrical signal, or a single conductor for each bus signal with all conductors in the bus using a single, common-ground return. Such a single-ended bus is prone to picking up noise or interference, resulting in a severe limitation on single-ended SCSI bus cable lengths at higher signal frequencies due to ground bounce, cross-talk, signal attenuation and signal reflections. "Differential" SCSI buses use balanced or differential signals, with each conductor on the SCSI bus having its own return line isolated from the reference ground. As a result, much longer cables may be used with a differential SCSI bus.

A differential current mode driver may be used to assert a signal on a differential SCSI bus conductor. Ideally, the output source and sink currents of a differential current mode driver should remain nearly equal in magnitude and opposite in direction to have minimal disruption on the cable. This is true both when the signal is being actively asserted or actively negated as well as when the signal is entering or exiting the tristate condition. Furthermore, in transitioning between the on-state and tristate conditions, the output of a differential current mode driver to a differential SCSI bus conductor should not transition instantly or take an inordinate amount of time. Rather, a differential current mode driver driving a differential SCSI bus conductor should behave in a slew-rate limited fashion.

It would be desirable, therefore, for a differential current mode driver attached to a SCSI bus to maintain nearly equal source and sink currents while providing a stable on-state, a controlled on-to-tristate transition, and a fast tristate-to-on transition. It would further be desirable for a differential current mode driver driving a SCSI bus conductor to employ three distinct time constants to regulate normal operation, power-down, and power-up.

SUMMARY OF THE INVENTION

A differential current mode driver is provided with output source and sink currents that remain nearly equal in magnitude and opposite in direction throughout normal, power-down, and power-up modes of operation. Three time constants are employed to regulate these different modes of operation. The differential current mode driver includes a first time constant to stabilize the output source and sink currents during the on-state, a second time constant to control the transition from the on-state to tristate, and a third time constant to control the transition from tristate to the on-state, all the while maintaining equal source and sink currents.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

A differential current mode driver for a SPI-2 implementation should provide output source and sink currents that remain nearly equal in magnitude and opposite in direction throughout normal, power-down, and power-up modes of operation. The differential current mode driver employs a first time constant to stabilize the output source and sink currents during the on-state, a second time constant to control the transition from the on-state to tristate, and a third time constant to control the transition from tristate to the on-state, all the while maintaining equal source and sink currents. Preferably a single integrated circuit should contain 27 differential current mode drivers, one for each of the 27 SCSI signals, that operate at up to 40 MHz and provide a maximum output of 10 mA. A single enable signal should force a minimum power state and tristate the output when asserted. A separate tristate signal may also exist that, independently of the enable signal, would tristate the output when asserted. Either the enable or tristate signal must be capable of controlling the differential current mode driver at a reduced signaling rate (less than 5 MHz) where the output toggles between active assertion and passive negation.

Figure 1A:
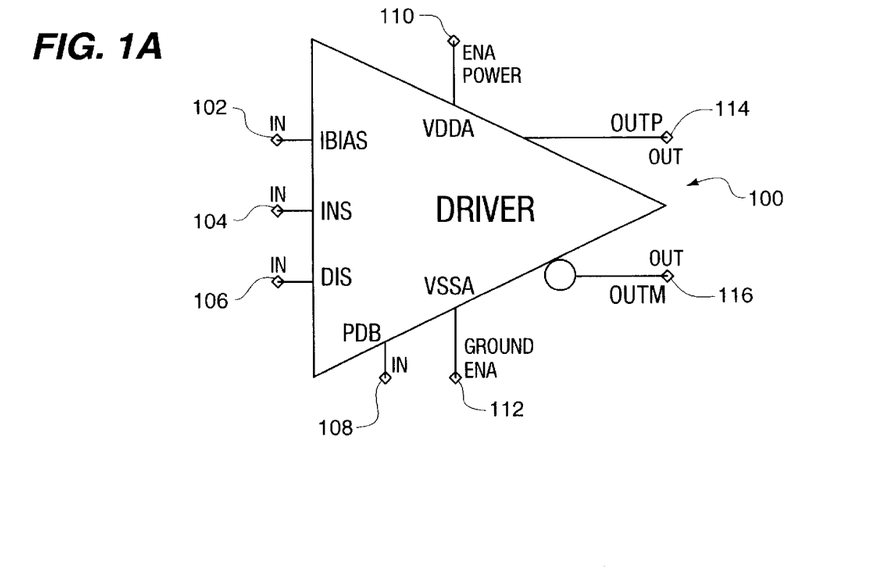
FIG. 1A–1C depict, respectively, a circuit symbol for a differential current mode driver, a simplified circuit diagram for the differential current mode driver as a part of a low voltage differential signaling transceiver, and a simplified circuit diagram for a low voltage differential signaling transceiver system in accordance with a preferred embodiment of the present invention.

With reference now to the figures, and in particular with reference to FIG. 1A, a circuit symbol for a differential current mode driver 100 of the present invention is depicted. Differential current mode driver 100 is one part of a low voltage differential signaling ("LVDS") transceiver (not shown) and may be employed in implementing SPI-2. Three modes of operation are defined for differential current mode driver 100: the normal mode of operation in which differential current mode driver 100 is in the on-state, the power-down mode of operation in which differential current mode driver 100 transitions from the on-state to tristate (also called the "off-state"), and the power-up mode of operation in which differential current mode driver 100 transitions from tristate to the on-state. As described below, each mode has an associated time constant regulating the operation of differential current mode driver 100.

Differential current mode driver 100 includes inputs 102–108, which carry signals IBIAS, INS, DIS, and PDB, respectively. Input 104 receives signal INS, which is an input signal carrying data. Input 102 receives signal IBIAS, which provides a biasing current to differential current mode driver 100. Input 106 receives a signal DIS (disable), which is used primarily in the depicted embodiment for backwards compatibility and secondarily to hold the differential current mode driver in tristate or power-down mode. Input 108 receives signal PDB (power-down bar), which is an input signal controlling power-down of the differential current mode driver.

Differential current mode driver 100 is powered by voltages applied to inputs 110 and 112. An upper power supply voltage, such as VDDA, is applied to input 110 while a lower power supply voltage, such as VSSA, is applied to input 112. Output signals OUTP from output 114 and OUTM from output 116, respectively, channel the source and sink currents to actively assert or negate a differential SCSI bus conductor.

When differential current mode driver 100 is in the on-state, one output 114 or 116 is sourcing current and the other output 114 or 116 is sinking current, depending on the state of input 104. Differential current mode driver 100 in the depicted example is non-inverting; that is, a digital high voltage at the INS input 104 when differential current mode driver 100 is in the on-state results in active assertion of the output signal. When the output signal is being actively asserted, a sourcing current is at OUTP output 114 and a sinking current at OUTM output 116. Similarly, a digital low voltage at the INS input 104 when differential current mode driver is in the on-state results in active negation of the output signal, or a sourcing current at OUTM output 116 and a sinking current at OUTP output 114. The current from OUTP output 114 to OUTM output 116 or vice versa runs through an external resistive termination (not shown) to produce a voltage on OUTP output 114 which is greater than the voltage on OUTM output 116 when the output signal is actively asserted and vice-versa when the output signal is actively negated. The external resistive termination or terminator provides a passive negation in the absence of any active or driven output signal.

Figure 1B:
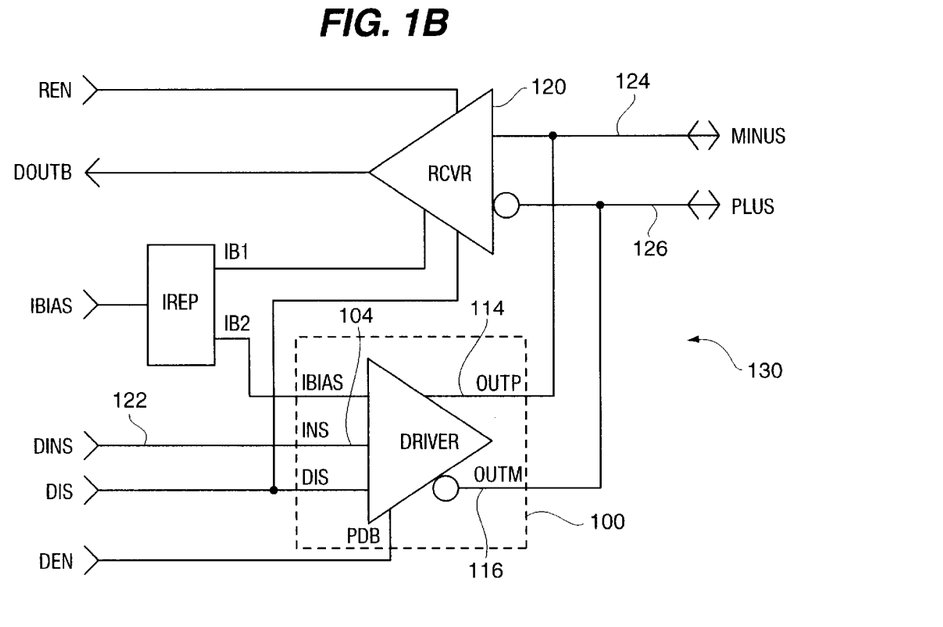

As noted above, differential current mode driver 100 is part of an LVDS transceiver which may be employed in implementing SPI-2. With reference now to FIG. 1B, a simplified circuit diagram for the differential current mode driver as a part of a low voltage differential signaling transceiver is depicted. The low voltage differential signaling (LVDS) transceiver 130 includes a receiver 120 as well as a differential current mode driver 100. LVDS transceiver 130 is inverting in the depicted example; that is, INS input 104 of differential current mode driver 100 is connected to the inverted data signal DINB of LVDS transceiver 130, while OUTP output 114 and OUTM output 116 of differential current mode driver 100 are respectively connected to MINUS cable conductor 124 and PLUS cable conductor 126 for the differential output signal.

Figure 1C:
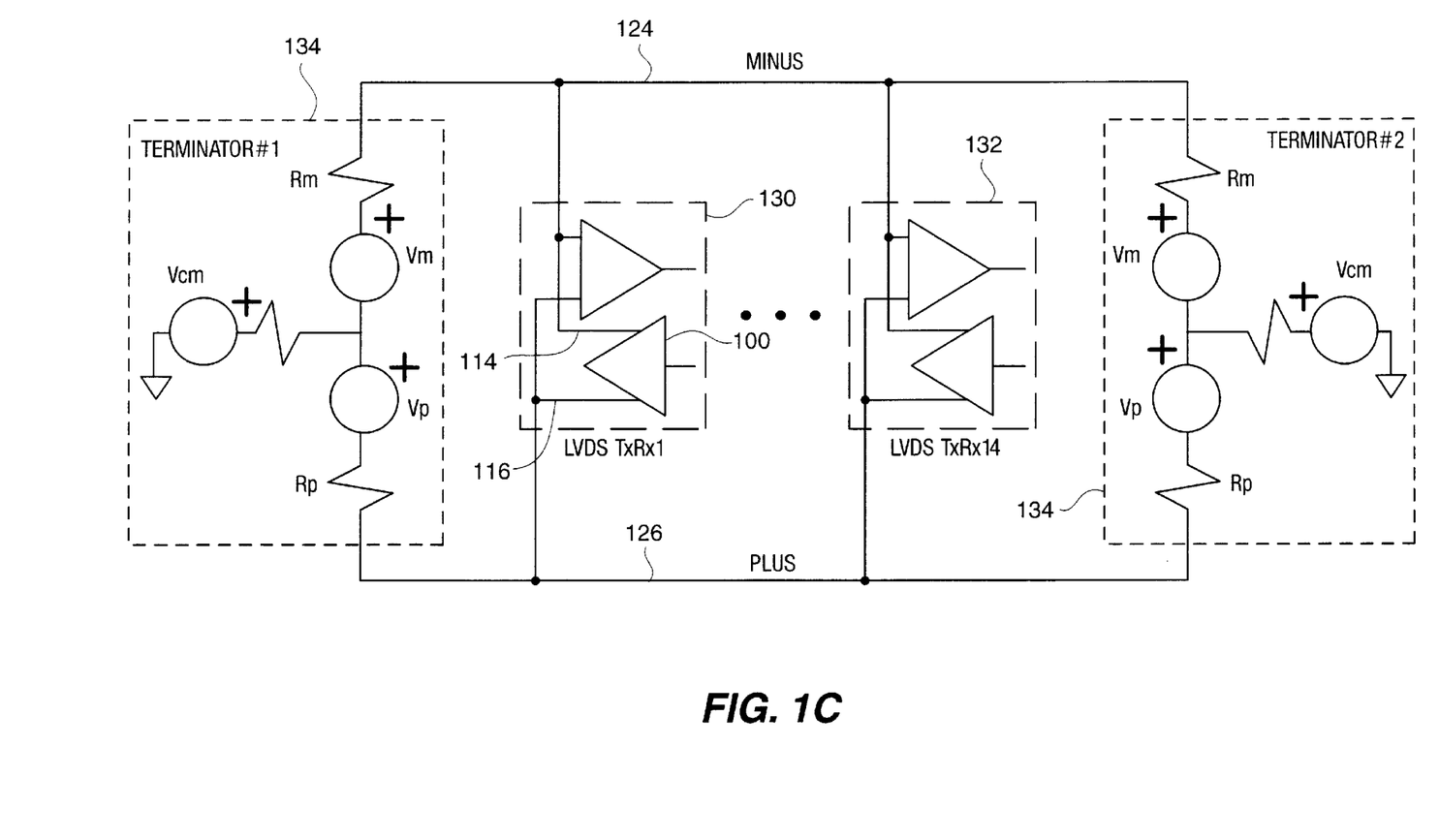

With reference now to FIG. 1C, a simplified circuit diagram for a low voltage differential signaling (LVDS) transceiver system is depicted. The example shown includes two LVDS transceivers 130 and 132 connected by a differential cable with a MINUS conductor 124 and a PLUS conductor 126.

In operation, differential current mode driver 100 requires resistive termination between its outputs 114 and 116. Typically the differential cable comprising MINUS and PLUS conductors 124 and 126 has a characteristic impedance of about 110 ohms. Two terminators 134 are attached to the cable, one at each end, each providing a differential impedance of about 110 ohms, a common-mode impedance of 150 ohms, a bias voltage of 120 mV, and a common mode voltage of 1.25 V. Although only two LVDS transceivers are shown in the depicted example, up to 16 LVDS transceivers may be attached to the same cable between terminators 134. Terminators 134 provide a positive voltage bias, typically ≈120 mV, between MINUS and PLUS cable conductors 124 and 126 to establish passive negation when no LVDS transceiver is driving an active assertion or active negation signal. Thus a symmetrical driver, one which provides equal assertion and negation currents, will produce an unbalanced signal on the differential cable. Therefore, differential current mode driver 100 is preferably asymmetrical, with the negation current being half that of the assertion current to provide a more balanced cable signal.

In implementing differential current mode driver 100 for an LVDS transceiver, preferably a single current source and a single current sink are provided with a switching network, controlled by a single-ended to complementary driver, to connect the source and sink to the appropriate output pins in response to input data. Four advantages exist for this architecture over employing separate current sources and sinks for each output pin. First, assuming a reasonable switching network is employed, the design can be constructed in an integrated circuit using less silicon area. Second, better source current and sink current matching between the pins is provided since the current for both pins comes from the same source or sink device. Third, power savings are achieved since a reasonable switching network contains less capacitance to charge and discharge than is required for controlling separate output current mirrors for each pin. Finally, the output source and sink currents are better behaved during data transitions since the current mirror transistors generating the source and sink currents can remain in saturation rather than having to "turn-on" and transition through the linear region.

Figure 2:
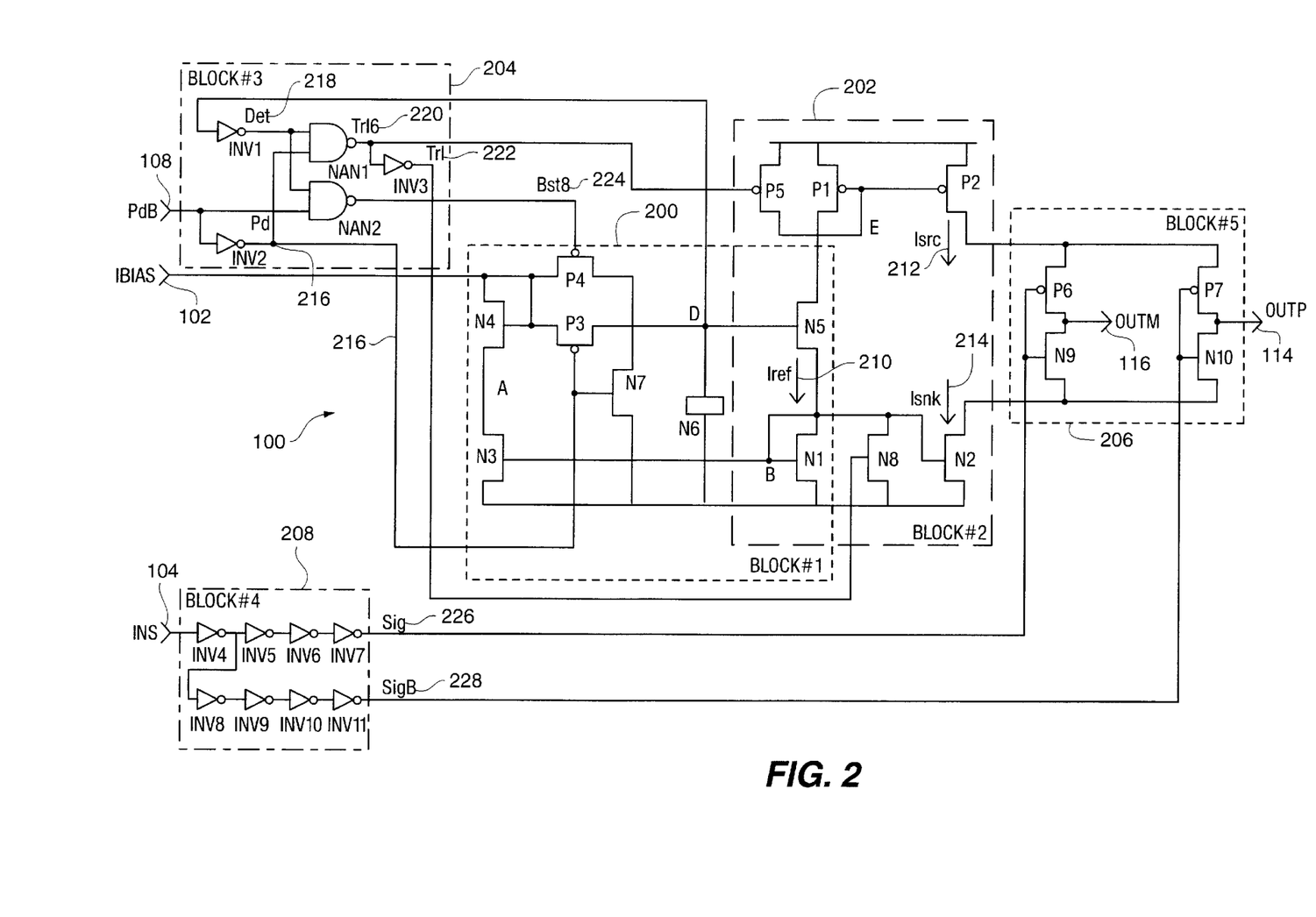
FIG. 2 is a simplified circuit diagram for critical portions of a differential current mode driver in accordance with the present invention.
Figure 3:
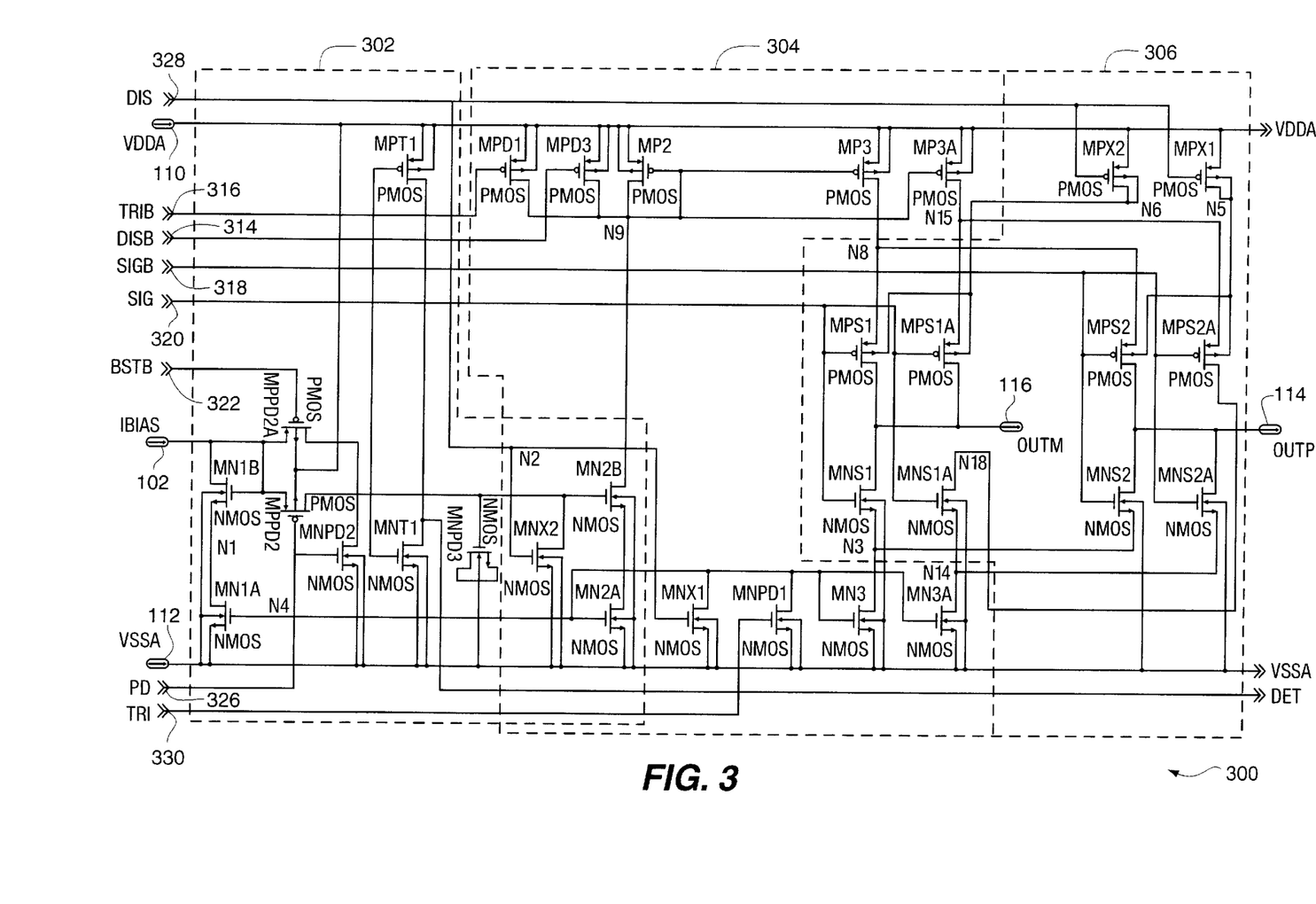
FIG. 3 depicts a circuit diagram for an on/off control for a differential current mode driver in accordance with a preferred embodiment of the present invention.
Figure 4:
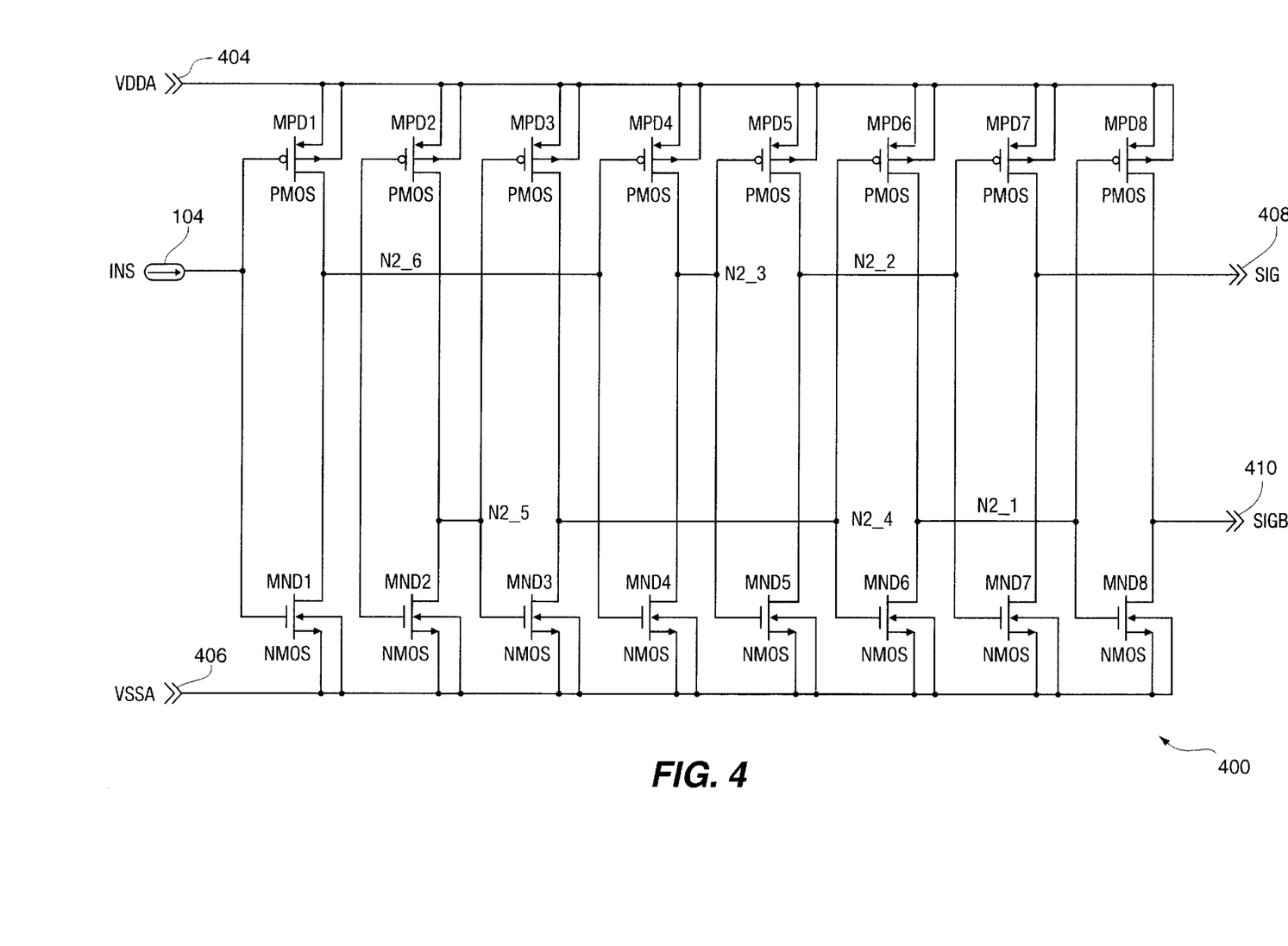
FIG. 4 is a circuit diagram for a single-ended to complimentary signal driver which may be used in conjunction with the differential current mode driver in accordance with a preferred embodiment of the present invention.
Figure 5:
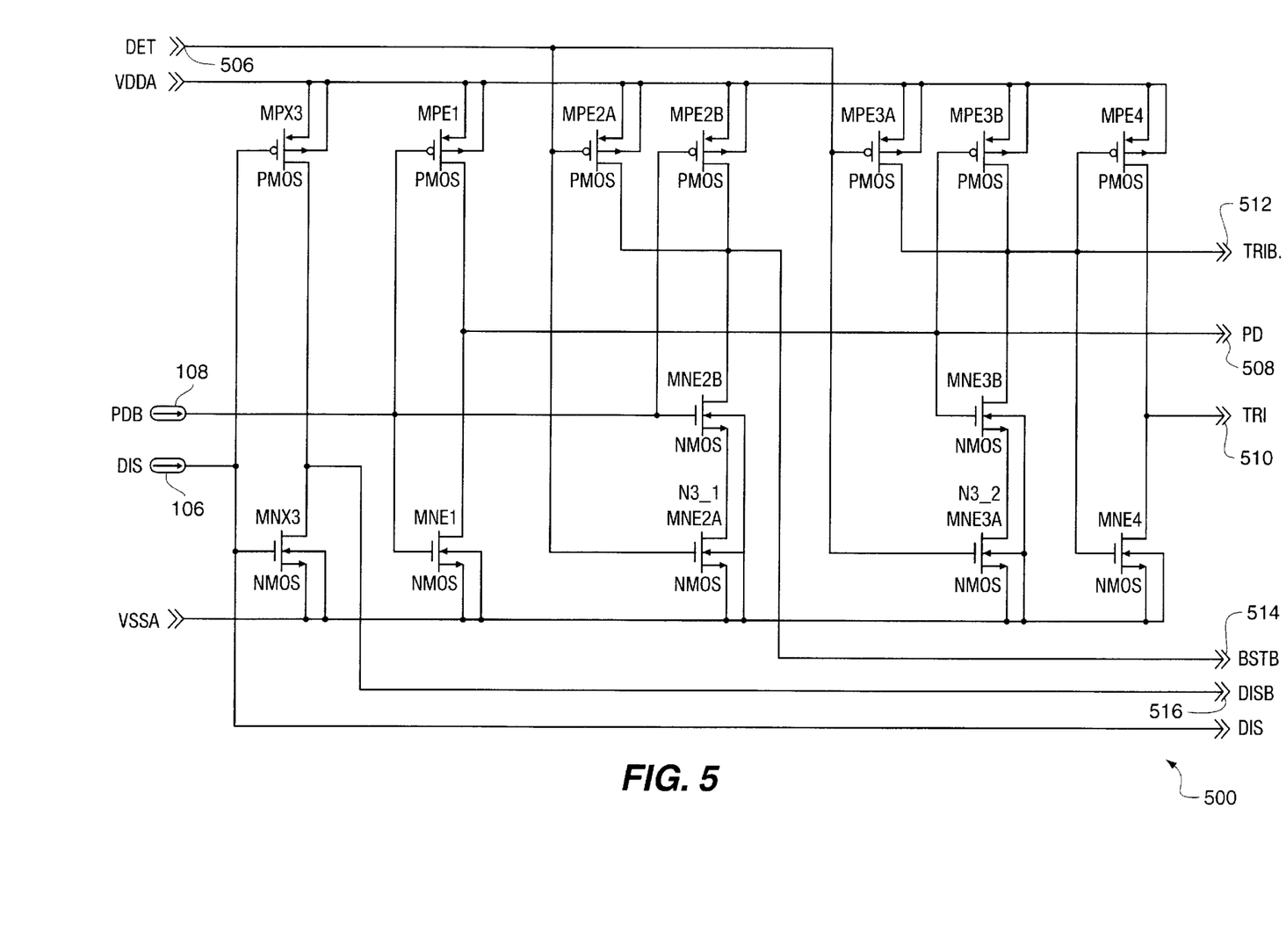
FIG. 5 depicts combinational logic circuitry for providing control signals to the differential current mode driver in accordance with a preferred embodiment of the present invention.

Referring now to FIG. 2, a simplified circuit diagram for a differential current mode driver in accordance with the present invention is depicted. FIG. 2 illustrates the principles of a differential current mode driver in accordance with the present invention, while FIGS. 3–5 depict an illustrative embodiment.

Differential current mode driver 100, depicted as a symmetrical driver for simplicity and clarity, comprises input current mirror 200, output current mirror 202, on/off control logic 204, differential output switches 206, and single-ended to complimentary driver 208. Input current mirror 200 starts as a modified Wilson current mirror comprising transistors N3, N4, N1, and N5. Input current mirror 200 attempts to accurately copy the biasing current $I_{bias}$ received at input 102 as reference current $I_{ref}$ 210.

Output current mirror 202 creates the source and sink currents, $I_{src}$ 212 and $I_{snk}$ 214, respectively, of differential current mode driver 100. Output current mirror 202 provides a 20:1 current gain at $I_{src}$ 212 and $I_{snk}$ 214 over $I_{ref}$ 210. This 20:1 current gain may be realized by building devices P2 and N2 from 20 parallel devices identical to devices P1 and N1, respectively.

Input current mirror 200 and output current mirror 202 are intimately connected, sharing transistors N1 and N5 so that a common reference current $I_{ref}$ 210 feeds the P1:P2 and N1:N2 output mirrors. In this manner, the magnitudes of source current $I_{src}$ 212 from device P2 and sink current $I_{snk}$ 214 from device N2 are matched as closely as possible.

Miller capacitance, the parasitic overlap capacitance between an MOS device's gate and drain, exists in devices P2 and N2 of output current mirror 202. The required dimensions of the devices of output current mirror 202 creates a substantial overlap capacitance between the output and the high impedance nodes of input current mirror 200. The effect is made worse by the 20:1 current gain. The result is an instability or oscillation in both output currents $I_{src}$ 212 and $I_{snk}$ 214. Therefore the modified Wilson current mirror of input current mirror 200 is further modified by placing an RC low-pass filter in its voltage loop. The low-pass filter capacitance, comprising the gate capacitance of devices N5 and N6, remains nearly constant. However, the resistance and its input are varied to provide three separate characteristic time constants for the normal, power-down, and power-up modes of operation.

In the normal mode of operation device P3, a long channel device, provides a large resistance with $I_{bias}$ 102 as an input, which results in a long time constant $\tau_1$ to stabilize the circuit in the on-state. While the long time constant ensures stable operation during the on-state, however, such a time constant would make power-up and power-down too sluggish. Therefore, separate time constants for each mode of operation may be provided. By imposing the time constant controls on control node D at the gate of device N5, nearly equal and opposite output source and sink currents, $I_{src}$ 212 and $I_{snk}$ 214 respectively, may be maintained.

The on-to-tristate transition is provided with a separate time constant from the on-state by using the lower resistance of device N7 with a grounded input in the low-pass filter. The channel resistance of device N7, together with the gate capacitances of devices N6 and N5, forms the low pass filter in the power-down mode. This creates a smaller time constant $\tau_2$ to slew-rate limit the voltage at control node D, resulting in a slew rate limited on-to-tristate transition of the output source and sink currents, $I_{src}$ 212 and $I_{snk}$ 214.

The tristate-to-on transition also is provided with a distinct time constant from the other two modes of operation by using a still lower resistance, the parallel combination of devices P3 and P4, with $I_{bias}$ 102 as the input. Activation of the input current mirror 200 from tristate is slowed by the substantial capacitance of the devices in output current mirror 202 and the fact that a substantial reference current $I_{ref}$ 210 will not flow until the voltage at control node D reaches a certain level. The resistance of P3 and P4 in parallel and the gate capacitances of devices N6 and N5, form the low pass filter in the power-up mode, creating the smallest time constant $\tau_3$ to speed the transition to the on-state.

Central to applying different time constants to different modes of operation is sensing of the voltage at control node D in order to determine the state of the driver. On/off control logic 204 uses the power down bar signal PdB at input 108 and feedback on the state of the differential current mode driver 100 from control node D to generate signals controlling the time constant. Inverter INV1 in on/off control logic 204 has as its input the voltage at control node D and its output signal Det 218. When differential current mode driver 100 is in the on-state, signal Det 218 is low; when differential current mode driver 100 is in tristate, signal Det 218 is high.

On/off control logic 204 generates signals Pd 216, TriB 220, Tri 222, and BstB 224 from Det 218 and signal PdB at input 108. Signal Pd 216 controls the gates of devices P3 and N7, switching the low pass filter between times constants $\tau_1$ or $\tau_3$ and time constant $\tau_2$. Signals TriB 220 and Tri 222 control clamping devices P5 and N8 respectively in the output current mirror 202. Clamping devices P5 and N5 reduce the output source and sink currents $I_{src}$ 212 and $I_{snk}$ 214 to zero when differential current mode driver 100 enters the tristate mode. Signal BstB 224 controls the gate of device P4 and switches the low pass filter between times constants $\tau_1$ and $\tau_3$.

Single-ended to complimentary driver 208 receives the digital data input signal INS at input 104 and, through a series of inverters having increasing drive strength, generates control signals Sig 226 and SigB 228. Differential output switches 206 use control signals Sig 226 and SigB 228 to direct the source and sink currents $I_{src}$ 212 and $I_{snk}$ 214 to the appropriate outputs OUTP 114 and OUTM 116. Source current $I_{src}$ 212 flows to output OUTP 114 when input INS 104 is at a high voltage, while sink current $I_{snk}$ 214 flows to output OUTM 116. When input INS 104 is at a low voltage, source current $I_{src}$ 212 flows to output OUTM 116 and sink current $I_{snk}$ 214 flows to output OUTP 114.

The conceptual design illustrated in FIG. 2 addresses the problems of stabilizing the on-state, slowing down the on-to-tristate transition edge, and speeding up the tristate-to-on transition edge while maintaining nearly equal source and sink currents.

With reference now to FIG. 3, a circuit diagram of an on/off control 300 for the differential current mode driver 100 in accordance with a preferred embodiment of the present invention is depicted. On/off control 300 includes an input current mirror 302, an output current mirror 304, and output switches 306.

On/off control 300 is powered by connections to an upper power supply voltage, such as upper power supply voltage VDDA at input 110, and a lower power supply voltage, such as power supply voltage VSSA at input 112, as depicted in FIG. 3. Input 102 receives a signal IBIAS while input 328, which is connected to input 106 in FIG. 1, receives signal DIS. Additionally, on/off control 300 receives the following signals from other portions of the differential current mode driver: DISB at input 314, TRIB at input 316, SIGB at input 318, SIG at input 320, BSTB at input 322, PD at input 326, and TRI at input 330. These input signals are generated in other portions of differential current mode driver 100 as described below with reference to FIGS. 4 and 5.

Input current mirror 302 includes series-connected transistors MN1A and MN1B and series-connected transistors MN2A and MN2B. In the depicted example, n-channel metal-oxide semiconductor (NMOS) transistors are employed in input current mirror 302. One series connected branch of input current mirror 302 includes transistor MN1A, which is connected at its source to a lower power supply voltage VSSA, and transistor MN1B, which is connected at its source to the drain of transistor MN1A and at its drain and gate to biasing current input IBIAS. A second series connected branch of input current mirror 302 includes transistor MN2A, which is connected at its source to a lower power supply voltage VSSA, and transistor MN2B, which is connected at its source to the gate and drain of transistor MN2A.

Transistors MN1B and MN2A of input current mirror 302 are diode-connected, with the gates of each transistor tied to the respective drains of the same transistor. The gates of transistors MN1A and MN2A are tied together.

Equal output source and sink currents are obtained by having the same current from input current mirror 302 run through the diode connected elements of both the n-channel and p-channel output mirrors. This is accomplished by connecting transistors MN2A and MP2 through transistor MN2B. The drain and gate of transistor MP2, a p-channel transistor in the depicted example, are connected to the drain of transistor MN2B and the gate of transistors MP3 and MP3A through node N9. Transistor MP2 is connected at its source to upper power supply voltage VDDA.

Output current mirror 304 provides a 20:1 current gain during active assertion and a 10:1 current gain during active negation as seen at outputs 114 and 116. This 20:1 or 10:1 current gain is over the output current of input current mirror 302, which is the current flowing through transistors MN2A and MN2B. Output current mirror 304 comprises transistors MN3, MN3A, MP3, MP3A, MP2, MPPD1, MPPD3, MNX1, and MNPD1. Input current mirror 302 and output current mirror 304 have transistors MN2A, MN2B, and MNX2 in common. Output switches 306 comprise transistors MNS1, MNS1A, MNS2, MNS2A, MPS1, MPS1A, MPS2, MPS2A, MPX1 and MPX2.

The high current gain within on/off control 300 compromises the stability of outputs 114 and 116 and requires compensation. A first time constant ($\tau_1$) created by a RC low-pass filter inserted into the current mirror's voltage loop is employed. The RC low pass filter uses the channel impedance of transistor MPPD2 and the gate capacitance of transistors MN2B and MNPD3. Transistors MPPD2 and MNPD3 in the depicted example are p-channel and n-channel MOS transistors, respectively. Transistor MPPD2 is located in the connection between the gates of transistors MN1B and MN2B in input current mirror 302. Transistor MPPD2 has its source connected to the gate of transistor MN1B through the node at input IBIAS 102 and its drain connected to the gate of transistor MN2B through node N2. The gate of transistor MPPD2, which is designed to have a high channel impedance, is connected to power-down input 326. Transistor MNPD3 is connected between node N2 and lower power supply voltage VSSA, with the gate connected to node N2 and the source and drain tied together and connected to lower power supply voltage VSSA. In this configuration, transistor MNPD3 acts as a capacitor having a value equal to the transistor's gate capacitance.

The resulting RC time constant $\tau_1$ created by transistors MPPD2, MN2B, and MNPD3 improves the stability of output signals OUTP and OUTM at outputs 114 and 116 respectively, compensating for voltage fluctuations that have been capacitively coupled from the outputs into the sensitive, high-impedance nodes of output current mirror 304 within the differential current mode driver. The noise coupled in by the Miller capacitance is larger than usual because of the high 20:1 and 10:1 current gains employed. Time constant $\tau_1$ regulates normal operations of the differential current mode driver and also the latter stages of power-up.

Input current mirror 302 also includes elements to control the on-to-tristate (on-state to tristate or power-down) transition to form a second time constant $\tau_2$, which is employed to control the output source and sink currents during the power-down transition. The logic signal power-down (PD) from input 326 is applied to the gate of transistor MPPD2 and isolates control node N2 at the gate of current mirror transistor MN2B. The channel resistance of transistor MNPD2, together with the gate capacitance of transistors MNPD3 and MN2B, provide a second RC time constant ($\tau_2$), which is selected to slowly reduce the voltage at node N2 in a slew rate limited fashion. Transistor MNPD2, a p-channel transistor in the depicted example, is connected at the source to lower power supply voltage VSSA, at the drain to control node N2, and at the gate to power-down input 326.

Clamping devices MPPD1 and MNPD1, controlled by signals TRIB at input 316 and TRI at input 330 respectively, are used to reduce the output source and sink currents to zero. Power-down signal PD applied to input 326 is used to initiate discharge of the voltage at node N2 through transistor MNPD2. When the voltage at node N2 becomes low enough, detect signal DET, which inverts the voltage at node N2 and passes the inverted signal to the combinational logic circuit (depicted in FIG. 5) used by the differential current mode driver, causes the combinational logic circuit described below with reference to FIG. 5 to assert TRIB and TRI signals at inputs 316 and 330, respectively. The signals activate clamping devices MPPD1 and MNPD1. Transistor MPPD1, a p-channel transistor in the depicted example, is connected at the source to upper power supply voltage VDDA, at the drain to the drain of transistor MP2 and the gate of transistors MP2, MP3, and MP3A through node N9, and at the gate to tristate input signal TRIB at input 316. Transistor MNPD1, an n-channel transistor in the depicted example, is connected at the source to lower power supply voltage VSSA, at the drain to the source of transistor MN2B, to the drain and gate of transistor MN2A, and to the gate of transistors MN3 and MN3A through node N4, and at the gate to tristate signal TRI at input 330.

Input current mirror 302 also includes elements to improve the speed of the tristate-to-on (tristate to on-state or power-up) transition. These elements form a third time constant ($\tau_3$) to control the output source and sink currents during the power-up transition. Activation of the current mirror from tristate (or the "off-state") typically is not quick. Transistors MP3, MP3A, MN3, and MN3A in output current mirror 304 present a substantial capacitance, about 24 picofarads in the preferred embodiment, and significant charging current does not flow until the voltage at node N2 reaches approximately $(2*V_{tn}+V_{dsatn}) \approx 1.7$ volts. Voltages $V_{tn}$ and $V_{dsatn}$ are the threshold and saturation voltages, respectively, of the n-channel transistors in input current mirror 302.

Faster initial charging of node N2 is accomplished through transistor MPPD2A in on/off control 300, which is controlled by BSTB signal applied to input 322 and provides a low-impedance path around the high-impedance of transistor MPPD2. That is, transistor MPPD2A, a p-channel MOS transistor in the depicted example, is designed to have lower channel impedance than transistor MPPD2 and allow speedier initial charging of node N2. As a result, differential current mode driver output source and sink currents begin to flow sooner in response to system control. Mirrored currents and gate capacitance provide a natural slew rate limited tristate-to-on transition. Transistor MPPD2A is connected at the source to biasing current input IBIAS and the drain and gate of current mirror transistor MN1B, at the drain to node N2, and at the gate to boost bar input 322 for signal BSTB.

Transistors MNX1, MNX2, MPX1 and MPX2 in on/off control 300, are controlled by disable signal DIS applied to input 328. These transistors, together with transistor MPPD3 controlled by disable bar signal DISB applied to input 314, are used in the depicted example for voltage feedthrough protection. The gates of transistors MNX1 and MNX2, both n-channel transistors in the depicted example, are both connected to disable input 328 for signal DIS. Transistor MNX1 is connected at the source to lower power supply voltage VSSA, and is connected at the drain to the source of current mirror transistor MN2B and the drain and gate of current mirror transistor MN2A. Transistor MNX2 is connected at the source to lower power supply voltage VSSA and at the drain to node N2. The gate of transistor MPPD3, a p-channel device in the depicted example, is connected to disable input 314 for signal DISB. Transistor MPPD3 is connected at the source to upper power supply voltage VDDA and at the drain node N9.

Central to on/off transition control in the depicted example is sensing of the voltage at node N2. This voltage is typically $2*(V_{tn}+V_{dsatn}) \approx 2.2$ volts in the on-state and 0 volts in tristate. Transistors MPT1 and MNT1 form a simple inverter with the voltage at node N2 as an input and detect signal DET as an output. Devices MPT1 and MNT1 are sized for a low switch point and have long channel lengths to keep flow-through current below about 1 micro-ampere. Transistor MPT1, a p-channel device in the depicted example, is connected at the source to upper power supply voltage VDDA. Transistor MNT1, an n-channel device in the depicted example, is connected at the source to lower power supply voltage VSSA. The gates of transistors MPT1 and MNT1 are tied together and connected to node N2. The drains of transistors MPT1 and MNT1 are tied together and connected to detect output 336 for detect signal DET. Detect signal DET is supplied to combinational logic circuitry (described below) for the differential current mode driver, which provides control signals BSTB, PD, TRI and TRIB to on/off control 300.

Referring to FIG. 4, a single-ended to complimentary signal driver which may be used in conjunction with the differential current mode driver 100 is depicted in accordance with a preferred embodiment of the present invention. The circuitry depicted represents only one example of various conventional single-ended to complimentary signal drivers which may be used in conjunction with a differential current mode driver in accordance with a preferred embodiment of the present invention. Single-ended to complimentary signal driver 400 receives an input signal INS at input 104. This input is connected to input 104 in FIG. 1. The circuit is powered by connections to upper supply voltage VDDA at input 404 and to lower power supply voltage VSSA at input 406. The circuit includes transistors MPD1–MPD8 and MND1–MND8. Transistors MPD1–MPD8 are PMOS transistors in the depicted example while transistors MND1–MND8 are NMOS transistors. Single-ended to complimentary signal driver 400 is used to convert a single-ended electrical signal INS at input 104 to complimentary electrical signals SIG and SIGB at outputs 408 and 410, respectively.

With reference now to FIG. 5, combinational logic circuitry for providing control signals BSTB, PD, TRI and TRIB to the differential current mode driver is depicted in accordance with a preferred embodiment of the present invention. Combinational logic circuit 500 includes transistors MPX3, MPE1, MPE2A, MPE2B, MPE3A, MPE3B, and MPE4, which are P-type metal oxide semiconductor (PMOS) transistors in the depicted example, and transistors MNX3, MNE1, MNE2A, MNE2B, MNE3A, MNE3B, and MNE4, which are N-type metal oxide semiconductor (NMOS) transistors in the depicted example. Combinational logic circuitry is powered by connecting the sources of transistors MPX3, MPE1, MPE2A, MPE2B, MPE3A, MPE3B, and MPE4 to an upper power supply voltage, such as power supply voltage VDDA, and connecting the sources of transistors MNX3, MNE1, MNE2A, MNE3A, and MNE4 to a lower power supply voltage, such as power supply voltage VSSA. Combinational logic circuit 500 receives as inputs power-down bar signal PDB at input 108, disable signal DIS at input 106, and detect signal DET at input 506. Power-down signal PD at output 508 is inverted from power-down bar signal PDB and initiates the discharge of node N2 in FIG. 3 as described above. Disable bar signal DISB at output 516 is inverted from DIS signal at input 106, where both DIS and DISB may be used in a second, more direct, method of tristating the differential current mode driver outputs. When the voltage at node N2 drops low enough in response to an asserted power-down bar signal PDB, detect signal DET causes activation of signal TRI at output 510 and signal TRIB at output 512 to activate clamping devices in the on/off control as described above with reference to FIG. 3. Boost bar signal BSTB at output 514 is activated when the voltage at node N2 is low and power-down signal PD is inactive—that is, when detect signal DET and power-down bar signal PDB are both high.

The circuitry disclosed is only one implementation which may be used for combinational logic driving the differential current mode driver, provided that the logical relationships between input and output signals described and depicted in on/off control logic 204 of FIG. 2 are maintained.

Figure 6A:
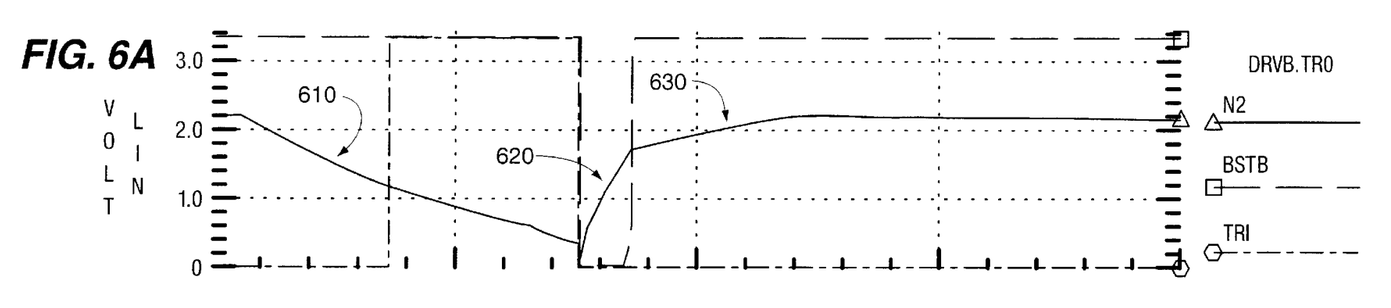
FIGS. 6A–6C are timing diagrams for selected signals during operation of the differential current mode driver in accordance with a preferred embodiment of the present invention.
Figure 6B:
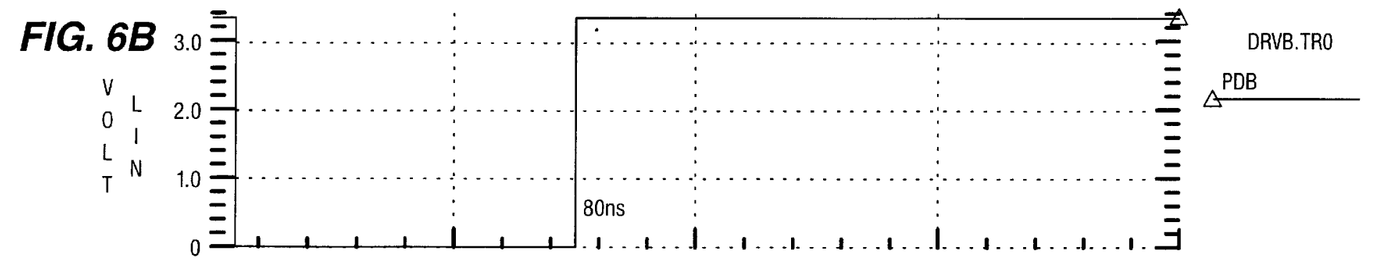
Figure 6C:
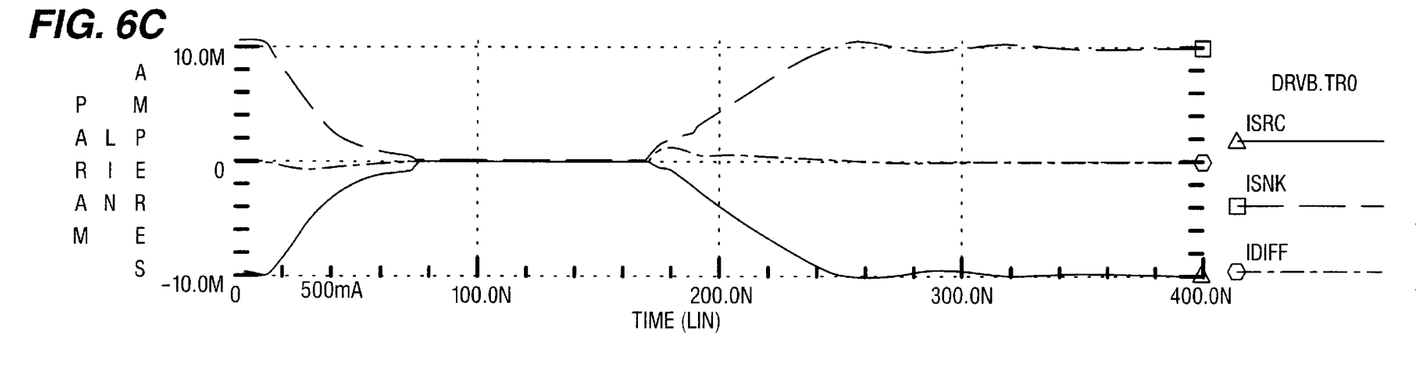

Referring to FIGS. 6A–6C, timing diagrams for selected signals during operation of the differential current mode driver of the present invention are depicted in accordance with a preferred embodiment of the present invention. The timing diagrams depicted are merely to illustrate the operation and relationship of the time constants for different modes of operation and are not meant to imply specific limits for the present invention.

At time 10 nanoseconds in the timing diagrams depicted, an on-to-tristate transition is initiated. The voltage at node N2, described above and depicted in FIG. 6A, declines in a slew rate limited fashion with a time constant of $\tau_2$ 610. As depicted in FIG. 6C, the source and sink currents from the differential current mode driver decay toward zero and shut off completely when node N2 drops below about 1.2 volts. The voltage at node N2 is clamped to zero at approximately 70 nanoseconds in the example depicted.

At time 150 nanoseconds in the timing diagrams depicted, a tristate-to-on transition is initiated. As depicted in FIG. 6A, the voltage at node N2 quickly reaches a level at which significant source and sink currents flow from the differential current mode driver, rising with a time constant of $\tau_3$ 620. At the point where significant source and sink currents begin to flow, approximately 20 nanoseconds after the tristate-to-on transition is initiated in the depicted example, the voltage at node N2 begins to stabilize at a time constant of $\tau_1$ 630. The source and sink currents, depicted in FIG. 6C, begin flowing approximately 20 nanoseconds after the tristate-to-on transition is initiated and reach maximum levels within less than approximately 100 nanoseconds in the example depicted. The differential current mode driver of the present invention thus maintains nearly equal source and sink currents while employing three distinct time constants to provide a stable on-state, a controlled on-to-tristate transition, and a fast tristate-to-on transition during normal operations, power-down, and power-up.

Thus, the present invention provides a balanced differential current mode driver with output source and sink currents that remain nearly equal in magnitude and opposite in direction, resulting in minimal disruption to the bus, such as a SCSI bus. The present invention provides balanced output source and sink currents in the on-state, the on-to-tristate, and the tristate-to-on modes of operation. The control of the output source and sink currents is provided through the use of three distinct time constants, $\tau_1$, $\tau_2$, and $\tau_3$ to regulate normal operation, power-down, and power-up for a differential current mode driver. In this manner, the present invention addresses the problems of stabilizing the on-state, slowing down the on-to-tristate edge, and speeding up the tristate-to-on edge while maintaining substantially equal source and sink currents in the differential current mode driver.

The description of the preferred embodiment of the present invention has been presented for purposes of illustration and description, but is not intended to be exhaustive or limit the invention in the form disclosed. Many modifications and variations will be apparent to those of ordinary skill in the art. The embodiment was chosen and described in order to best explain the principles of the invention and the practical application to enable others of ordinary skill in the art to understand the invention for various embodiments with various modifications as are suited to the particular use contemplated.

What is claimed is:

1. A driver comprising:
   single-ended to differential signal means for generating a differential signal from a single-ended input; and
   filtering means for filtering the differential signal, wherein the filtering means imposes a first time constant on the differential signal when the driver is in an on-state, a second time constant when the driver transitions from the on-state to a tristate, and a third time constant when the driver transitions from the tristate to the on-state.

2. The driver of claim 1, wherein the single-ended to differential signal means further comprises:
   control means for controlling the filtering means;
   input current means for generating a reference current from a bias current input;
   output current means for generating a source current and a sink current from the reference current; and
   output switches directing the source current to a first output and the sink current to a second output in response to a first state of the single-ended input signal and directing the source current to the second output and the sink current to the first output in response to a second state of the single-ended input signal.

3. The driver of claim 2, wherein the input current means further comprises:
   first and second transistors connected in series, wherein a drain and a gate of the first transistor are connected to the bias current input and a source of the second transistor is connected to a power supply voltage;
   third and fourth transistors connected in series, wherein a source of the third transistor is connected to a gate and a drain of the fourth transistor, a source of the fourth transistor is connected to the power supply voltage, and the gate of the fourth transistor is connected to a gate of the second transistor;
   a fifth transistor having a source connected to a gate of the first transistor, a drain connected to a gate of the third transistor, and a gate connected to a first control signal from the control means; and a sixth transistor having a source and a drain connected to the power supply voltage and a gate connected to the gate of the third transistor,
   wherein the third, fifth, and sixth transistors provide the first time constant.

4. The driver of claim 3, wherein the output current means further comprises the third and fourth transistors.

5. The driver of claim 3, wherein the input current means further comprises:
   a seventh transistor having a source connected to the power supply voltage, a drain connected to the gate of the third transistor, and a gate connected to the first control signal, wherein the third, sixth, and seventh transistors provide the second time constant.

6. The driver of claim 5, wherein the input current means further comprises:
   an eighth transistor having a source connected to the bias curent input, a drain connected to the gate of the third transistor, and a gate connected to a second control signal from the control means, wherein the third, fifth, sixth and eighth transistors provide the third time constant.

7. A differential current mode driver having a plurality of modes of operation, comprising:
   an input current mirror receiving a biasing current and generating a reference current;
   a low pass filter having a plurality of characteristic time constants in a voltage loop of the input current mirror;
   a control circuit switching the low pass filter between time constants in response to a change in a present mode of operation of the differential current mode driver;
   an output current mirror generating a source current and a sink current proportional to the reference current, wherein the source current and the sink current are substantially equal in magnitude and opposite in direction; and
   output switches directing the source current to a first output and the sink current to a second output in response to a first state of the single-ended input signal and directing the source current to the second output and the sink current to the first output in response to a second state of the single-ended input signal.

8. The differential current mode driver of claim 7, wherein the plurality of modes of operation comprise a normal mode, a power-down mode, and a power-up mode.

9. The differential current mode driver of claim 8, wherein the control circuit switches the low pass filter to a first time constant when the differential current mode driver is in the normal mode, to a second time constant when the differential current mode driver is in the power-down mode, and to a third time constant when the differential current mode driver is in the power-up mode.

10. The differential current mode driver of claim 9, wherein the first time constant is longer than the second time constant and the second time constant is longer than the third time constant.

11. The differential current mode driver of claim 9, wherein the low pass filter comprises first, second, and third resistive elements and capacitive elements, the first resistive element and the capacitive elements providing the first time constant, the second resistive element and the capacitive elements providing the second time constant, and the first and third resistive elements and the capacitive elements providing the third second time constant.

12. The differential current mode driver of claim 7, wherein a portion of the output current mirror comprises a portion of the input current mirror which generates the reference current.

13. A method of controlling a differential current mode driver having a plurality of modes of operation, comprising:

utilizing an input current mirror to provide a reference current;

generating a source current and a sink current proportional to the reference current, wherein the source current and the sink current are substantially equal in magnitude and opposite in direction; and connecting one set of elements within a plurality of sets of elements to a control node in the current mirror to generate a time constant for a voltage at the control node, wherein each set of elements of the plurality of sets of elements corresponds to one mode of operation within the plurality of modes of operation and generates a time constant which differs from a time constant generated by other sets of elements within the plurality of sets of elements.

14. The method of controlling a differential current mode driver of claim 13, wherein said step of connecting one set of elements within a plurality of sets of elements to a control node further comprises:

connecting a first set of elements to the control node when the differential current mode driver is in a corresponding first mode of operation to generate a first time constant;

connecting a second set of elements to the control node when the differential current mode driver is in a corresponding second mode of operation to generate a second time constant; and connecting a third set of elements to the control node when the differential current mode driver is in a corresponding third mode of operation to generate a third time constant.

15. The method of controlling a differential current mode driver of claim 13, further comprising:

detecting a mode of operation of the differential current mode driver utilizing a voltage at the control node.

* * * * *